United States Patent
Waheed

(10) Patent No.: US 10,079,647 B2
(45) Date of Patent: Sep. 18, 2018

(54) DC OFFSET CALIBRATION OF WIRELESS RECEIVERS

(71) Applicant: FREESCALE SEMICONDUCTOR, INC., Austin, TX (US)

(72) Inventor: Khurram Waheed, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 14/565,745

(22) Filed: Dec. 10, 2014

(65) Prior Publication Data

US 2016/0173048 A1     Jun. 16, 2016

(51) Int. Cl.
| | |
|---|---|
| H03G 3/20 | (2006.01) |
| H04L 27/08 | (2006.01) |
| H04B 17/21 | (2015.01) |
| H03G 3/00 | (2006.01) |
| H03G 3/30 | (2006.01) |

(52) U.S. Cl.
CPC ............ *H04B 17/21* (2015.01); *H03G 3/001* (2013.01); *H03G 3/3078* (2013.01)

(58) Field of Classification Search
CPC ... H04B 2001/305; H04B 17/21; H04L 25/06; H03D 3/008; H03G 3/20
See application file for complete search history.

(56) References Cited

U.S. PATENT DOCUMENTS

| | | |
|---|---|---|
| 6,516,185 B1 | 2/2003 | MacNally |
| 6,560,448 B1 | 5/2003 | Baldwin et al. |
| 6,735,422 B1 * | 5/2004 | Baldwin ............... H03D 3/008 455/232.1 |
| 6,868,128 B1 | 3/2005 | Lane |
| 6,941,121 B2 | 9/2005 | Chen |
| 7,030,795 B1 | 4/2006 | Saunders et al. |
| 7,146,141 B2 | 12/2006 | Chen |

(Continued)

FOREIGN PATENT DOCUMENTS

EP     1524811 B1     7/2010

OTHER PUBLICATIONS

Gil et al., "Joint ML estimation of carrier frequency, channel, I/Q mismatch, and DC offset in communication receivers," in IEEE Transactions on Vehicular Technology, vol. 54, No. 1, pp. 338-349, Jan. 2005.

(Continued)

*Primary Examiner* — Shuwang Liu
*Assistant Examiner* — Sung Ahn

(57) ABSTRACT

A receiver system includes an automatic gain control (AGC) module configured to control a first gain control signal to a first gain element having variable gain control. The receiver system also includes a DC (direct current) offset correction block coupled to the AGC module, the DC offset correction block configured to trigger the AGC module to output a set of calibration gain control signals to the first gain element and capture a set of DC offset measurements of a first signal received at the DC offset correction block, where the first signal is passed by the first gain element. The DC offset correction block is further configured to estimate one or more DC offset components using the set of DC offset measurements, and calculate a first correction control signal corresponding to a first gain level of the first gain element using the one or more DC offset components.

19 Claims, 2 Drawing Sheets

(56) References Cited

U.S. PATENT DOCUMENTS

| | | |
|---|---|---|
| 7,348,808 B2 | 3/2008 | Moussavi |
| 7,353,010 B1 | 4/2008 | Zhang |
| 7,397,304 B2 | 7/2008 | Wang |
| 7,472,101 B2 | 12/2008 | Aurora et al. |
| 7,522,900 B2 | 4/2009 | Allott et al. |
| 7,548,738 B2 | 6/2009 | Srinivasan et al. |
| 7,890,075 B2 | 2/2011 | Xin et al. |
| 7,899,431 B2 | 3/2011 | Rahman et al. |
| 7,929,650 B2 | 4/2011 | Sobchak et al. |
| 8,010,077 B2 | 8/2011 | Ivonnet et al. |
| RE42,799 E | 10/2011 | Baldwin et al. |
| 8,150,360 B2 | 4/2012 | Ivonnet et al. |
| 8,260,235 B1* | 9/2012 | Khlat .............. H04B 1/30 455/226.1 |
| 8,525,586 B2 | 9/2013 | Chen |
| 8,545,411 B2 | 10/2013 | Bae et al. |
| 8,588,719 B1 | 11/2013 | Mehrotra |
| 8,614,603 B1 | 12/2013 | Wyse et al. |
| 8,615,212 B2* | 12/2013 | Li .............. H03G 3/3068 455/239.1 |
| 8,626,099 B2 | 1/2014 | Li et al. |
| 8,638,883 B2 | 1/2014 | Ashkenazi et al. |
| 8,666,343 B2 | 3/2014 | Shanan |
| 9,264,280 B1* | 2/2016 | Waheed ........... H04L 27/3809 |
| 2002/0042256 A1* | 4/2002 | Baldwin .......... H03D 3/008 455/232.1 |
| 2002/0120937 A1 | 8/2002 | Chang |
| 2002/0197975 A1* | 12/2002 | Chen ............. H04B 1/30 455/324 |
| 2003/0081693 A1 | 5/2003 | Raghavan et al. |
| 2003/0100286 A1* | 5/2003 | Severson .......... H03D 3/009 455/324 |
| 2003/0199264 A1 | 10/2003 | Holenstein et al. |
| 2004/0152432 A1* | 8/2004 | Gu .............. H04B 1/30 455/136 |
| 2004/0157573 A1* | 8/2004 | Lee .............. H03F 3/45995 455/197.2 |
| 2006/0222117 A1* | 10/2006 | Rahman .......... H03D 3/008 375/345 |
| 2007/0004359 A1 | 1/2007 | Srinivasan et al. |
| 2007/0058739 A1* | 3/2007 | Aytur ............. H03G 3/3068 375/260 |
| 2007/0190960 A1 | 8/2007 | Akamine et al. |
| 2008/0165899 A1* | 7/2008 | Rahman .......... H04B 1/30 375/319 |
| 2008/0273636 A1 | 11/2008 | Zhu et al. |
| 2009/0264090 A1* | 10/2009 | Ivonnet ........... H04L 25/06 455/233.1 |
| 2010/0172450 A1 | 7/2010 | Komaili et al. |
| 2011/0105070 A1 | 5/2011 | Li et al. |
| 2012/0034895 A1 | 2/2012 | Xuechu et al. |
| 2012/0155347 A1 | 6/2012 | Husted et al. |
| 2013/0082682 A1 | 4/2013 | Horvath |
| 2013/0102267 A1 | 4/2013 | Haub et al. |
| 2013/0195215 A1 | 8/2013 | Manglani et al. |

OTHER PUBLICATIONS

Waheed, et al., U.S. Appl. No. 14/604,291, "DC Offset Tracking of Wireless Receivers", Filed Jan. 23, 2015.
Office Action—U.S. Appl. No. 14/749,884, dated May 2, 2016, 24 pages.
Non-final Rejection—U.S. Appl. No. 14/603,443, dated May 29, 2015, 13 pages.
Notice of Allowance—U.S. Appl. No. 14/603,443, dated Oct. 30, 2015, 7 pages.
Office Action—U.S. Appl. No. 14/749,884, dated Jul. 8, 2016, 18 pages.
Notice of Allowance—U.S. Appl. No. 14/749,884, dated Oct. 28, 2015, 23 pages.

* cited by examiner

DC OFFSET CALIBRATION OF WIRELESS RECEIVERS

BACKGROUND

Field of the Disclosure

The present disclosure relates in general to integrated circuit devices, and more specifically to DC offset calibration of wireless receivers.

Description of the Related Art

Direct conversion receivers convert an RF carrier waveform directly to a baseband frequency. Receiver impairments such as inadequate carrier suppression, 2nd order inter-modulation, mismatches and inherent offsets in the active circuits of the receiver front end all contribute to a DC offset in the down-converted baseband signal. This DC offset can seriously impede normal operation of a receiver by causing saturation, automatic gain control failure, analog-to-digital converter (ADC) dynamic range waste and/or incorrect demodulation by a modem.

DC offset compensation is often used in direct conversion receivers. Factory calibration of DC offsets increases production cost and mechanisms are required to store and manage the data on the device, however. Additionally, DC offsets vary with gain and frequency, so calibration over-all operating conditions can take a lot of time and generate a large amount of data that can consume an impractical amount of space on an integrated circuit die. Alternatively, DC offset calibrations done over only a small subset of radio conditions will be suboptimal for a set of radio operational conditions leading to poor performance. Moreover, any DC offset factory calibration done on an RF part does not capture any DC impairments that might be specific to the final build configuration of a radio.

BRIEF DESCRIPTION OF THE DRAWINGS

The benefits, features, and advantages of the present disclosure will become better understood with regard to the following description, and accompanying drawings where.

DETAILED DESCRIPTION

Embodiments disclosed herein provide a time-efficient mechanism to calibrate a wireless receiver at the beginning of every warm-up. The receiver has a generalized DC offset generation mechanism comprising RF, receiver front end and baseband components of I/O branch DC offsets. A DC level after an analog-to-digital conversion is estimated for three distinct gain settings and then a system of equations is solved to estimate the DC offset components (RF, Rx FE and baseband), which are (1) an RF component (such as LO feed through) or a jamming induced signal component at the carrier, which scales with both low noise amplifier and mixer (LNM) and baseband filter (BBF) gains, (2) a baseband DC component such as amplifier offset common-mode voltage mismatch, that scales with BBF gains, and (3) a third component, which represents an un-scaled DC offset at an analog to digital (ADC) input. The estimated DC components are then used to estimate a multi-point DC offset correction calibration value for each gain setting in the receiver (i.e., for the complete Rx gain table), which are stored in memory or a lookup table implemented in circuitry. The DC correction values are then applied, as needed, as a function of receiver gain.

Figure 1:
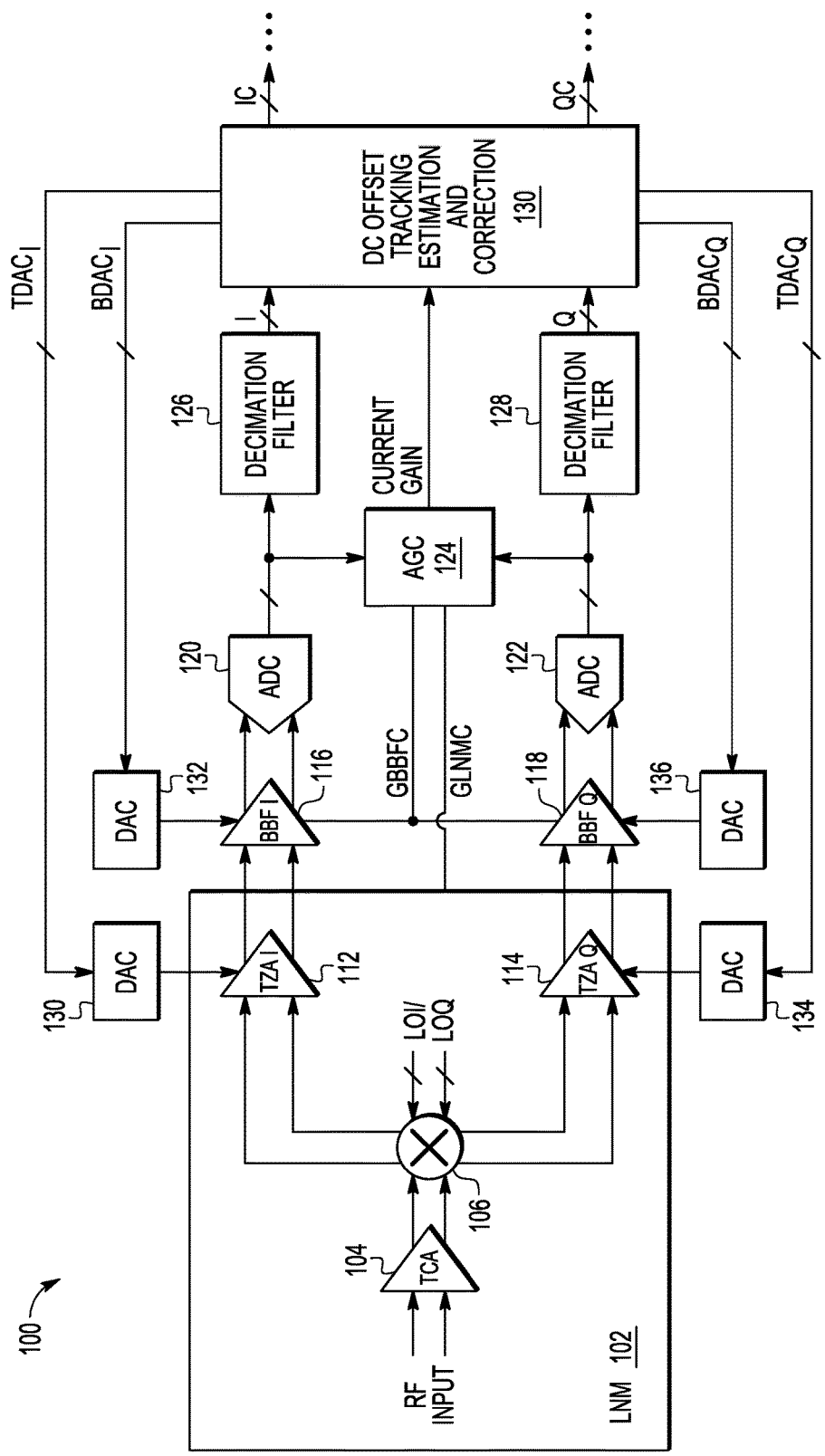
FIG. 1 is a block diagram of a direct conversion receiver system according to an embodiment.

FIG. 1 is a block diagram of a wireless receiver system 100 according to an embodiment that includes low noise amplifier and mixer (LNM) 102 with transconductance amplifier (TCA) 104, mixer 106, in-phase transimpedance amplifier (TZA) 112 and quadrature TZA 114. TCA 104 receives RF inputs, and provides amplified RF inputs to mixer 106. Mixer 106 generates the in-phase and quadrature RF signals when combined with in-phase and quadrature local oscillator signals LOI, LOQ. The in-phase and quadrature RF signals are input to respective TZA amplifiers 112, 114.

Receiver system 100 includes independent branches for processing the differential in-phase and quadrature signals from mixer 106 using components such as respective transimpedance amplifiers 112, 114, baseband filter amplifiers 116, 118, analog to digital converters 120, 122, and decimation filters 126, 128. Automatic gain control module 124 is coupled to receive digital signals from analog to digital converters 120, 122, and to provide gain control signals GLNMC, GBBFC to LNM 102 and baseband filter amplifiers 116, 118, respectively.

Receiver system 100 further includes DC offset estimation and correction module 130 coupled to receive in-phase and quadrature signals (I, Q) from respective decimation filters 126, 128. DC offset estimation and correction module 130 provides digital to analog converter (DAC) correction signals BDACI, TDACI, BDACQ, TDACQ to respective DACs 130, 132, 134, 136. In-phase and quadrature TZAs 112, 114 and BBFs 116, 118 are coupled to receive analog DC offset correction signals from respective DACs 130-136.

The sources of DC offset in receiver system 100 can originate in several different locations. A first component referred to as in-phase and quadrature RF DC offset (shown in FIG. 1 as $\alpha I$ and $\alpha Q$) is found in the input to TCA 104 or mixer 106. The DC offset in the RF typically scales with the gain in LNM 102 (i.e., gain in mixer 106, TCA 104 and TZAs 112, 114) as well as gain in BBFs 116, 118. A second component referred to as TZA DC offset (shown in FIG. 1 as $\beta I$ and $\beta Q$) is found in the output of TZAs 112, 114 and scales with BBF gain. A third component referred to as baseband DC offset (shown in FIG. 1 as $\gamma I$ and $\gamma Q$) is found in the output of BBFs 116, 118 and does not scale with receiver front end (analog) gain. Note that in some implementations, a static gain may affect the DC offset due to mapping in ADCs 120, 122 from analog to digital representation.

Figure 2:
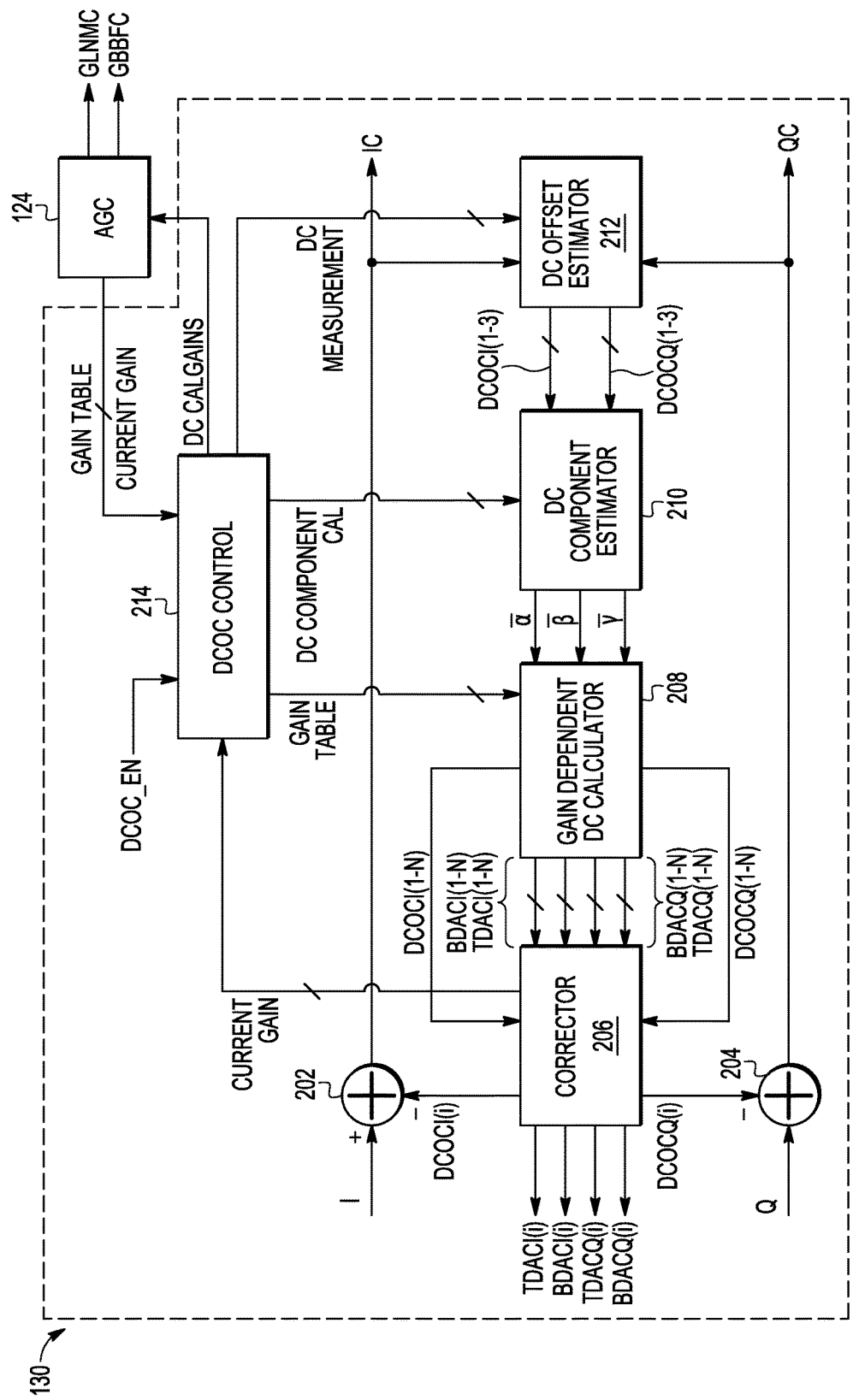
FIG. 2 is a block diagram of an embodiment of a DC offset estimation and correction module that can be used in the direct conversion receiver system of FIG. 1.

Referring to FIGS. 1 and 2, FIG. 2 is a block diagram of an embodiment of DC offset estimation and correction module 130 that can be used in the direct conversion receiver system 100 of FIG. 1. Note that the in-phase and quadrature identifiers are not shown for the DC offset parameters $\alpha$, $\beta$, and $\gamma$ in FIG. 2. The calculations for DC offset parameters $\alpha$, $\beta$, and $\gamma$ are carried out and stored independently for in-phase and quadrature branches. At any given time, the total DC offsets observed at the inputs to ADCs 120, 122 are the sum of RF DC offset $\alpha$+TZA DC offset $\beta$+baseband DC offset $\gamma$. Gain due to ADCs 120, 122 (where applicable) can be accounted for based on the gain GBBF in the baseband filters 116, 118, gain GLNM in TCA 104, mixer 106 and TZAs 112, 114, total DC offset due to RF DC offset $\alpha$, TZA DC offset $\beta$, and baseband DC offset $\gamma$ by an ADC gain factor according to the following equation:

$$RxDCOC_{post_{ADC}} \cong ADC_{gain} * (GBBF * (GLNM * \alpha + \beta) + \gamma).$$

For example, an ADC output comprising of a thermometric code with 17 levels when converted to a binary number with 5 bits ($2^5=32$) would have a systematic gain of 0.53125 (17/32) applied to the output of ADCs 120, 122. The total ADC gain factor will be (17/32)*input voltage dynamic range/the number of thermometric levels. Other types of ADCs can be used in system 100 other than sigma-delta ADCs, in which case, the ADC gain factor would be different.

The embodiment of DC offset estimation and correction module 130 shown includes summing junctions 202, 204, corrector module 206, gain dependent DC calculator 208, DC component estimator 210, DC offset estimator 212, and DCOC control 214. Summing junction 202 receives the in-phase signal (I) from decimation filter 126 and subtracts an in-phase DC offset correction signal DCOCI(i), where the index i refers to the index of the gains currently being used in system 100. Summing junction 204 receives the quadrature signal (Q) from decimation filter 128 and subtracts a quadrature DC offset correction signal DCOCQ(i), where the index i refers to the index of the gains currently being used in system 100. The corrected in-phase and quadrature I and Q signals from summing junctions 202, 204 are provided to DC offset estimator 212.

DC offset correction (DCOC) control module 214 receives an enable signal (DCOC_EN) that may be provided by another controller (not shown), and a gain table along with the current gain(s) being used in system 100 from automatic gain controller 124. DCOC control module 214 provides gains calibrated for DC offsets to AGC 124. In addition, DCOC control module 214 provides the current gain(s) to corrector 206, the gain table to gain dependent DC calculator 208, DC component calibration signals to DC component estimator 210, and a DC calibration step to DC offset estimator 212. The DC offset calibration step includes applying a set of gain parameters to the receiver front end circuitry (TZA, BBF, etc.) and estimating in the receive digital domain (after analog to digital conversion) the resultant DC level in the I and Q signal branches.

DC component estimator 210 can use three distinct combinations of LNM and BBF gain settings to calculate DC offset parameters $\alpha$, $\beta$, and $\gamma$. The gains chosen for the three calibration points can be chosen such that two distinct LNM and BBF gain points are used. Other suitable choices for the gains can be used, however. An example of the three combinations are shown in Table 1 below:

TABLE 1

| DCOC (DC Offset Correction Calibration) | LNM Gain (dB) | BBF Gain (dB) | LNM linear gain (V/V) | BBF linear gain (V/V) | DC offset Measured at ADC input |
|---|---|---|---|---|---|
| DCOC[1] | $L_{LO}$ | $B_{LO}$ | $G_{L\_LO}$ | $G_{B\_LO}$ | ADC_gain $*(G_{B\_LO}*(G_{L\_LO}* \alpha + \beta) + \gamma)$ |
| DCOC[2] | $L_{HI}$ | $B_{LO}$ | $G_{L\_HI}$ | $G_{B\_LO}$ | ADC_gain $*(G_{B\_LO}*(G_{L\_HI}* \alpha + \beta) + \gamma)$ |
| DCOC[3] | $L_{LO}$ | $B_{HI}$ | $G_{L\_LO}$ | $G_{B\_HI}$ | ADC_gain $*(G_{B\_HI}*(G_{L\_LO}* \alpha + \beta) + \gamma)$ |

Note that linear LNM and BBF gains can be calculated from the LNM and BBF gain in decibels in Table 1 using the following equation (1) as an example:

$$G_{L\_LO}=10^{\wedge}(L_{LO}/20). \quad (1)$$

DC component estimator 210 uses the DCOC(1-3) parameters in the following equations to estimate of DC offset parameters $\alpha$, $\beta$, and $\gamma$ (which are referred to as alpha_hat, beta_hat and gamma_hat and are shown in FIG. 2 with a bar over $\alpha$, $\beta$, and $\gamma$):

$$\text{alpha\_hat}=\alpha*\text{ADC\_gain}=(\text{DCOC}[2]-\text{DCOC}[1])/\\((G_{L\_HI}-G_{L\_LO})*G_{B\_LO}) \quad \text{Equation (2)}$$

$$\text{DCOC\_tmp}=(G_{L\_LO}*\text{alpha\_bar}+\text{beta\_bar})*\text{ADC\_}\\\text{gain}=(\text{DCOC}[3]-\text{DCOC}[1])/(G_{B\_HI}-G_{B\_LO}) \quad \text{Equation (3)}$$

$$\text{beta\_hat}=\beta*\text{ADC\_gain}=\text{Equation}(3)-\text{Equation}(2)\\*G_{L\_LO} \quad \text{Equation (4)}$$

$$\text{gamma\_hat}=\gamma*\text{ADC\_gain}=\text{DCOC}[3]-\text{Equation}(3)\\*G_{B\_HI} \quad \text{Equation (5)}$$

Once the estimates for $\alpha$, $\beta$, and $\gamma$, that is alpha_hat, beta_hat and gamma_hat are determined, the calibrated DC offset correction values BDACI(1-N), BDACQ(1-N), TDACI(1-N), TDACQ(1-N), DCOCI(1-N) and DCOCQ (1-N) for a gain table such as shown in TABLE 2 can be calculated. Note that 1 . . . N are the indices of the entries in the gain look-up table.

TABLE 2

| RSSI (dBm) | LNM linear gain (V/V) | BBF linear gain (V/V) | TZA-I DAC Correction | BBF-I DAC Correction | TZA-Q DAC Correction | BBF-Q DAC Correction |
|---|---|---|---|---|---|---|
| $R_1$ | $G_{L0}$ | $G_{B0}$ | $TDACI_1$ | $BDACI_1$ | $TDACQ_1$ | $BDACI_1$ |
| ... | ... | ... | ... | ... | ... | ... |
| $R_N$ | $G_{LN}$ | $G_{BN}$ | $TDACI_N$ | $BDACI_N$ | $TDACQ_N$ | $BDACQ_N$ |

The following formulas can be used to calculate the DC offset correction values BDACI(1-N), BDACQ(1-N), TDACI(1-N), TDACQ(1-N), DCOCI(1-N) and DCOCQ (1-N).

$$\text{TZA\_TOTAL\_}I(i)=\text{alpha\_hat\_}I*G_{Li}+\text{beta\_hat\_}I$$

$$\text{TDACI}(i)=\text{round}(\text{TZA\_TOTAL\_}I(i)/\text{TZA\_dcoc\_step})$$

$$\text{TZA\_RESIDUAL\_}I(i)=\text{TZA\_TOTAL\_}I(i)-\text{TDACI}(i)\\*\text{TZA\_dcoc\_step}$$

$$\text{BBF\_TOTAL\_}I(i)=\text{TZA\_residual\_}I(i)*G_{Bi}+\text{gamma\_}\\\text{hat\_}I$$

$$\text{BDACI}(i)=\text{round}(\text{BBF\_TOTAL\_}I(i)/\text{BBF\_dcoc\_step})$$

$$\text{BBF\_RESIDUAL\_}I(i)=\text{BBF\_TOTAL\_}I(i)-\text{BDACI}(i)\\*\text{BBF\_dcoc\_step}$$

$$\text{DCOCI}(i)=\text{BBF\_RESIDUAL\_}I(i)$$

$$\text{TZA\_TOTAL\_}Q(i)=\text{alpha\_hat\_}Q*+\text{beta\_hat\_}I$$

$$\text{TDACQ}(i)=\text{round}(\text{TZA\_TOTAL\_}Q(i)/\text{TZA\_dcoc\_}\\\text{step})$$

$$\text{TZA\_RESIDUAL\_}Q(i)=\text{TZA\_TOTAL\_}Q(i)-\text{TD-}\\\text{ACQ}(i)*\text{TZA\_dcoc\_step}$$

$$\text{BBF\_TOTAL\_}Q(i)=\text{TZA\_residual\_}Q(i)*G_{Bi}+\\\text{gamma\_hat\_}Q$$

$$\text{BDACQ}(i)=\text{round}(\text{BBF\_TOTAL\_}Q(i)/\text{BBF\_dcoc\_}\\\text{step})$$

$$\text{BBF\_RESIDUAL\_}Q(i)=\text{BBF\_TOTAL\_}Q(i)-\text{BDACQ}\\(i)*\text{BBF\_dcoc\_step}$$

$$\text{DCOCQ}(i)=\text{BBF\_RESIDUAL\_}Q(i)$$

The terms BBF_dcoc_step and TZA_dcoc_step represent the DC offset correction least siginificant bit (LSB) size of the BBF and TZA DC offset correction DACs translated to the location of the DC offset estimator as a function of receiver (i.e., TZA and BBF) gains and ADC analog-to-digital mapping. The step size for estimating the DC offset for the TZA and BBF DACS 130, 134 can be determined as follows:

TZA_dcoc_step_norm=TZA_dac_step/ ADC_LSB*AGC_Gain

BBA_dcoc_step=BBA_dac_step/ ADC_LSB*AGC_Gain

Once the offset correction table (e.g., TABLE 2) is filled for all gain combinations, correction module 206 can be used to select from among DC offset correction values BDACI(1-N), BDACQ(1-N), TDACI(1-N), TDACQ(1-N), DCOCI(1-N) and DCOCQ(1-N) based on the current gain.

The calibration sequence can be initiated by an initialization signal from a controller (not shown) for receiver 100. As described herein, the calibration can be performed at three combinations of gain settings specified in registers that are accessible by DC offset estimator 212 and DC component estimator 210. DC Offset estimator 212 estimates the I and Q DC offset using valid I and Q samples from respective decimation filters 126, 128 over a selected period of time. The estimates of the I and Q DC offsets are stored for 3 combinations of gain settings. Once the I and Q DC offsets are determined, DC component estimator 210 calculates alpha_hat, beta_hat and gamma_hat components. A gain table (e.g., Table 2) relating the DC components for all combinations of LNM_gains and BBF_gains can then be populated. DC offset estimation and correction module 130 can then enter a wait or stop state until AGC 124 indicates a change in receiver gain. Alternatively, once the DC calibration table is filled, the DC offset estimation and correction module 130 can automatically apply the DC offsets corresponding to a default receiver gain chosen for receiver initialization. When a gain change is communicated by AGC 124, the respective corrections of the gain combination applied by AGC 124 can be applied to DACs 130-136 and summing junctions 202, 204.

By now it should be appreciated that in some embodiments, a receiver system can comprise an automatic gain control (AGC) module (124) configured to control a first gain control signal to a first gain element (LNA/TCA/TZA/BBF) having variable gain control, and a DC (direct current) offset correction block (128) coupled to the AGC module. The DC offset correction block can be configured to trigger the AGC module to output a set of calibration gain control signals (GBBFC, GLNMC) to the first gain element, and capture a set of DC offset measurements of a first signal (in-phase or quadrature) received at the DC offset correction block. The first signal can be passed by the first gain element. One or more DC offset components can be estimated using the set of DC offset measurements, and a first correction control signal (TDAC/BDAC) corresponding to a first gain level of the first gain element can be calculated using the one or more DC offset components (performed online/runtime or offline/initialization).

In another aspect, the DC offset correction block (128) can be further configured to calculate a plurality of correction control signals (TDAC/BDAC) corresponding to a plurality of gain levels (1–N) of the first gain element using the one or more DC offset components (can be offline/init calculation).

In another aspect, the receiver system can further comprise a first digital-to-analog converter (DAC) (130, 134). The DC offset correction block (128) can be further configured to output the first correction control signal (TDAC/BDAC) to the first DAC. The first DAC can be configured to output a first DC offset correction signal to the first gain element (LNA/TCA/TZA), and the first DC offset correction signal can be configured to correct one or more of the one or more DC offset components (e.g., alpha, beta).

In another aspect, the AGC module (124) can be further configured to control a second gain control signal to a second gain element (LNA/TCA/TZA/BBF) having variable gain control. The first signal can be further passed by the second gain element, and the DC offset correction block (128) can be further configured to trigger the AGC module to output the set of calibration gain control signals to the second gain element.

In another aspect, the receiver system can further comprise a second DAC (132, 136). The DC offset correction block (128) can be further configured to output a second correction control signal (TDAC/BDAC) to the second DAC. The second DAC can be configured to output a second DC offset correction signal to the second gain element (BBF), and the second DC offset correction signal can be configured to correct a residual remaining from the first DC offset correction signal and the one or more DC offset components (gamma).

In another aspect, the AGC module can be further configured to set the first gain control signal (LNA/TCA/TZA gain control) to a first value (L_Lo/L_Hi) and the second gain control signal (BBF gain control) to a second value (B_Lo/B_Hi) for a time period, and the DC offset correction block can be configured to capture one of the set of DC offset measurements during the time period.

In another aspect, the set of DC offset measurements can include a number of measurements that is based on a number of DC offset components exhibited in the receiver system (number of measurements is one more than number of gain elements in the signal chain, or alternately number of measurements matches the number of DC offset components in the receiver system), and the number of DC offset components can be based on a number of gain elements in the receiver system (equal in number).

In another aspect, each DC offset component can scale with a cascade of gains exhibited by successive gain elements that pass the first signal, and the successive gain elements can be located in the receiver system before an input of the DC offset correction block.

In another aspect, the one or more DC offset components can comprise a first DC offset component ($\alpha$ in input line at LNA/TCA) that scales with a combination of a first gain of the first gain element (LNA/TCA/TZA gain) and a second gain of the second gain element (BBF gain), a second DC offset component ($\beta$ out of TZA) that scales with the second gain (BBF gain), and a third DC offset component ($\gamma$ out of BBF).

In another aspect, the DC offset correction block (128) can be further configured to store each of the plurality of correction control signals and a corresponding gain level in a respective entry of a lookup table, and the correction control signals are selected from the lookup table as a function of a current gain setting of the first gain element.

In another aspect, the receiver system can further comprise an analog-to-digital converter (ADC) (120, 122) configured to map an output of the second gain element (116, 118) to a digital representation having a slope. The slope can correspond to an ADC gain term representing a translation from a voltage of the output of the second gain element to the digital representation.

In another aspect, the first DAC (130, 134) can be configured to map the first correction control signal (TDAC/BDAC) to the first DC offset correction signal having an analog component. The first DAC exhibits a DAC gain term representing a translation from a digital representation of the DC offset correction signal to the analog component.

In another aspect, the first signal can be one of an in-phase signal and a quadrature signal, and the first gain element can be part of an RF (radio frequency) down-conversion stage.

In another aspect, the second gain element can be at least one of an in-phase amplifier (BBF-I) and a quadrature amplifier (BBF-Q).

In another embodiment, a semiconductor device can comprise a receiver system including a first gain element (LNA/TCA/TZA/BBF), and a DC (direct current) offset correction block (128) configured to capture a set of DC offset measurements of a first signal (in-phase or quadrature) passed by the first gain element received at the DC offset correction block, estimate one or more DC offset components using the set of DC offset measurements, and calculate a first correction control signal (TDAC/BDAC) corresponding to a first gain level of the first gain element using the one or more DC offset components (performed online/runtime or offline/initialization).

In another embodiment, a method of operating a receiver system can comprise triggering an automatic gain control (AGC) module (124) of the receiver system to output a set of calibration gain control signals to one or more gain elements (LNA/TCA/TZA/BBF) having variable gain control, capturing a set of DC offset measurements of a first signal (in-phase or quadrature) passed by the one or more gain elements, estimating one or more DC offset components (e.g., alpha, beta, gamma) using the set of DC offset measurements, and calculating one or more correction control signals (TDAC/BDAC) corresponding to one or more gain levels of the first gain element using the one or more DC offset components (performed online/runtime or offline/initialization).

In another aspect, the method can further comprise setting, by the AGC module, a respective gain control signal (LNA/TCA/TZA/BBF gain control) of each of the one or more gain elements according to a subset of the set of calibration values (L_Lo/L_Hi/B_Lo/B_Hi) for a time period. One of the set of DC offset measurements can be captured during the time period.

In another aspect, the method can further comprise outputting each of the one or more correction control signals (TDAC/BDAC) to one or more digital-to-analog converters (DACs). Each of the one or more DACs can be configured to output a DC offset correction signal to one of the one or more gain elements (LNA/TCA/TZA/BBF), and each DC offset correction signal can correspond to one of the one or more correction control signals.

In another aspect, a combination of each DC offset correction signal output by the one or more DACs is configured to correct the one or more DC offset components (e.g., alpha, beta, gamma).

In another aspect, the method can further comprise storing each of the one or more correction control signals and a corresponding one of the one or more gain levels in a respective entry of a lookup table, and selecting one of the one or more correction control signals from the lookup table as a function of a current gain setting of each of the one or more gain elements.

This disclosure is presented to enable one of ordinary skill in the art to make and use the present disclosure as provided within the context of a particular application and its requirements. Various modifications to the preferred embodiments will, however, be apparent to one skilled in the art, and the general principles defined herein may be applied to other embodiments. Therefore, the present disclosure is not intended to be limited to the particular embodiments shown and described herein, but is to be accorded the widest scope consistent with the principles and novel features herein disclosed.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Also for example, in one embodiment, the illustrated elements of systems disclosed herein are circuitry located on a single integrated circuit or within a same device. Alternatively, the systems may include any number of separate integrated circuits or separate devices interconnected with each other. Also for example, a system or portions thereof may be soft or code representations of physical circuitry or of logical representations convertible into physical circuitry. As such, a system may be embodied in a hardware description language of any appropriate type.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The term "coupled" is defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

What is claimed is:

1. A receiver system comprising:
an automatic gain control (AGC) circuitry configured to
control a first gain control signal to a first gain element having variable gain control;
control a second gain control signal to a second gain element having variable gain control;
a DC (direct current) offset correction circuitry coupled to the AGC circuitry, the DC offset correction circuitry configured to
trigger the AGC circuitry to output a set of calibration gain control signals to the first and second gain elements;
capture a set of DC offset measurements of a first signal received at the DC offset correction circuitry, wherein the first signal is passed by the first and second gain elements;
estimate DC offset components using the set of DC offset measurements, the DC offset components including a first DC offset component that is a function of low noise amplifier gain and baseband filter gain, a second DC offset component that is a function of the baseband filter gain without the low noise amplifier gain, and a third DC offset component that is a function of the baseband filter offset and analog to digital converter offset;
calculate a first correction control signal corresponding to a first gain level of the first gain element using the DC offset components;
calculate a second correction control signal corresponding to the first gain level of the second gain element using the DC offset components.

2. The receiver system of claim 1, further comprising:
a first digital-to-analog converter (DAC), wherein
the DC offset correction circuitry is further configured to output one of the correction calibration signals to the first DAC,
the first DAC is configured to output a first DC offset correction signal to the first gain element, and
the first DC offset correction signal is configured to correct one or more of the DC offset components.

3. The receiver system of claim 2, further comprising:
a second DAC, wherein
the DC offset correction block is further configured to output another one of the correction calibration signals to the second DAC,
the second DAC is configured to output a second DC offset correction signal to the second gain element, and
the second DC offset correction signal is configured to correct a residual remaining from the first DC offset correction signal and the DC offset components.

4. The receiver system of claim 2, wherein
the first DAC is configured to map the one of the correction calibration signals to the first DC offset correction signal having an analog component, wherein the first DAC exhibits a DAC gain term representing a translation from a digital representation of the DC offset correction signal to the analog component.

5. The receiver system of claim 2, wherein
the AGC circuitry is further configured to
control a second gain control signal to a second gain element having variable gain control,
the first signal is further passed by the second gain element, and
the DC offset correction circuitry further configured to trigger the AGC circuitry to output the set of calibration gain control signals to the second gain element.

6. The receiver system of claim 1, wherein
the AGC circuitry is further configured to
set the first gain control signal to a first value and the second gain control signal to a second value for a time period, and
the DC offset correction circuitry is configured to capture one of the set of DC offset measurements during the time period.

7. The receiver system of claim 1, wherein
the set of DC offset measurements includes a number of measurements that is based on a number of DC offset components exhibited in the receiver system, and
the number of DC offset components is based on a number of gain elements in the receiver system.

8. The receiver system of claim 1, wherein
each DC offset component scales with a cascade of gains exhibited by successive gain elements that pass the first signal, and
the successive gain elements are located in the receiver system before an input of the DC offset correction block.

9. The receiver system of claim 1, wherein
the DC offset correction circuitry is further configured to store each of the plurality of correction calibration signals and a corresponding gain level in a respective entry of a lookup table, and
the correction calibration signals are selected from the lookup table as a function of a current gain setting of the first gain element.

10. The receiver system of claim 1, further comprising
an analog-to-digital converter (ADC) configured to map an output of the second gain element to a digital representation having a slope, wherein
the slope corresponds to an ADC gain term representing a translation from a voltage of the output of the second gain element to the digital representation.

11. The receiver system of claim 1, wherein
the first signal is one of an in-phase signal and a quadrature signal, and
the first gain element is part of an RF (radio frequency) down-conversion stage.

12. The receiver system of claim 1, wherein
the second gain element is at least one of an in-phase amplifier and a quadrature amplifier.

13. The receiver system of claim 1, wherein
the DC offset correction circuitry is further configured to
calculate a plurality of correction control signals corresponding to a plurality of gain levels of the first gain element using the DC offset components.

14. A semiconductor device comprising:
a receiver system including:
a first gain element;
a second gain element; and
a DC (direct current) offset correction circuitry configured to capture a set of DC offset measurements of a first signal received at the DC offset correction circuitry, wherein
the first signal is passed by the first and second gain elements;
estimate DC offset components using the set of DC offset measurements, wherein
a first DC offset component is estimated based on a difference between high and low low noise amplifier gain and low baseband filter gain,
a second DC offset component is estimated based on a difference between high baseband filter gain and the low baseband filter gain, and the low low noise amplifier gain, and
a third DC offset component is estimated based on the baseband filter offset and analog to digital converter offset; and
calculate correction calibration signals corresponding to a first gain level of the first gain element using the DC offset components.

15. A method of operating a receiver system comprising:
triggering an automatic gain control (AGC) circuitry of the receiver system to output a set of calibration gain control signals to gain elements having variable gain control;
capturing a set of DC offset measurements of a first signal, wherein the first signal is passed by the gain elements;
estimating DC offset components using the set of DC offset measurements based on a difference between high and low low noise amplifier gains, and low baseband filter gain for a first of the DC offset components, low low noise amplifier gain and a difference between high and low baseband filter gains for a second of the DC offset components, and baseband filter offset and analog to digital converter offset for a third of the DC offset components; and
calculating correction calibration signals over a range of gain levels of the gain elements using the DC offset components.

16. The method of claim 15, further comprising:
setting, by the AGC circuitry, a respective gain control signal of each of the gain elements according to a subset of the set of calibration values for a time period, wherein
one of the set of DC offset measurements is captured during the time period.

17. The method of claim 15, further comprising:
outputting respective ones of the correction calibration signals to first and second digital-to-analog converters (DACs), wherein
each of the DACs is configured to output a DC offset correction signal to one of the gain elements, and
each DC offset correction signal corresponds to one of the correction calibration signals.

18. The method of claim 17, wherein
a combination of each DC offset correction signal output by the first and second DACs is configured to correct the DC offset components.

19. The method of claim 15, further comprising:
storing each of the one or more correction calibration signals and a corresponding one of the one or more gain levels in a respective entry of a lookup table; and
selecting one of the one or more correction calibration signals from the lookup table as a function of a current gain setting of each of the gain elements.

* * * * *